United States Patent
Hwang

(10) Patent No.: US 9,479,170 B2
(45) Date of Patent: Oct. 25, 2016

(54) BUFFER CIRCUIT AND OPERATION METHOD THEREOF

(71) Applicant: SK hynix Inc., Gyeonggi-do (KR)

(72) Inventor: Tae Jin Hwang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/550,544

(22) Filed: Nov. 21, 2014

(65) Prior Publication Data

US 2016/0149575 A1    May 26, 2016

(51) Int. Cl.
*H03K 19/003* (2006.01)
(52) U.S. Cl.
CPC ................ *H03K 19/00384* (2013.01)
(58) Field of Classification Search
CPC ............. H03K 19/1776; H03K 19/21; H03K 19/215; H03K 19/172; H03K 3/012
USPC ................... 327/77, 199, 276, 333
See application file for complete search history.

(56) References Cited

U.S. PATENT DOCUMENTS

| | | | |
|---|---|---|---|
| 5,644,546 A * | 7/1997 | Furumochi | G11C 5/143 365/189.09 |
| 8,476,937 B2 * | 7/2013 | Em | G11C 7/1078 327/108 |

FOREIGN PATENT DOCUMENTS

| | | |
|---|---|---|
| KR | 100557622 | 3/2006 |
| KR | 100587068 | 6/2006 |

\* cited by examiner

*Primary Examiner* — John Poos
(74) *Attorney, Agent, or Firm* — IP & T Group LLP

(57) ABSTRACT

A buffer circuit includes an amplification unit suitable for sensing and amplifying an input signal and a reference voltage, a buffer enable unit suitable for enabling the amplification unit based on a buffer enable signal, and a buffer enable signal generation unit suitable for generating the buffer enable signal based on a first or second operation control signal, selected according to a high voltage detection signal.

15 Claims, 3 Drawing Sheets

BUFFER CIRCUIT AND OPERATION METHOD THEREOF

FIELD OF THE INVENTION

Various embodiments relate to a semiconductor device, and more particularly, to a buffer circuit of a semiconductor device.

BACKGROUND

A buffer circuit senses and amplifies an input signal to generate an output signal. An electronic device including a semiconductor device may operate by transmitting and receiving signals between internal components of the electronic device or between the electronic device and an external component. Signal transmission and reception may be more accurately performed through a buffer circuit. The buffer circuit may repeat an input signal or convert a swing amplitude of an input signal. With increased integration degree and decreased power consumption in electronic devices, the power supply voltage (i.e. voltage level) used in electronic devices has been continuously reduced. When power supply voltage is reduced, swing amplitude of signals transmitted between internal components of electronic devices or between electronic devices and external components is also reduced. Thus, waveforms of buffer circuit output signals are sensitive to variations in process, voltage and temperature (i.e., PVT), and the output signal may be easily distorted. Therefore, operational stability of the buffer circuit needs to be secured to accurately transmit and receive signals.

In general, the buffer circuits include a differential amplifying circuit. The differential amplifying circuit may compare an input signal with a reference signal and amplify the difference between the input signal and the reference signal.

SUMMARY

Various embodiments are directed to a buffer circuit that may sufficiently secure the time required for stabilization according to power supply voltage.

In an embodiment of the present invention a buffer circuit may include: an amplification unit suitable for sensing and amplifying an input signal and a reference voltage; a buffer enable unit suitable for enabling the amplification unit based on a buffer enable signal; and a buffer enable signal generation unit suitable for generating the buffer enable signal based on a first or a second operation control signal selected according to a high voltage detection signal.

In an embodiment of the present invention, a buffer circuit may include: an amplification unit suitable for sensing and amplifying an input signal and a reference voltage; a buffer enable unit suitable for enabling the amplification unit based on a buffer enable signal; and a buffer enable signal generation unit suitable for generating the buffer enable signal based on an active operation control signal or a control signal for read and write operations, selected according to a high voltage detection signal.

In an embodiment of the present invention, a buffer circuit may include: a buffer unit suitable for buffering an input signal based on a buffer enable signal; and a buffer enable signal generation unit suitable for generating the buffer enable signal based on a first or second operation control signal, selected according to a power supply voltage detection signal, wherein the first operation control signal is activated before the second operation control signal is activated.

In an embodiment of the present invention, an operation method of a buffer circuit may include: detecting a power supply voltage; generating a buffer enable signal based on an active operation control signal when the power supply voltage is relatively high; generating the buffer enable signal based on a write operation control signal when a power supply voltage is relatively high; and buffering an input signal based on the buffer enable signal.

DETAILED DESCRIPTION

Figure 1:
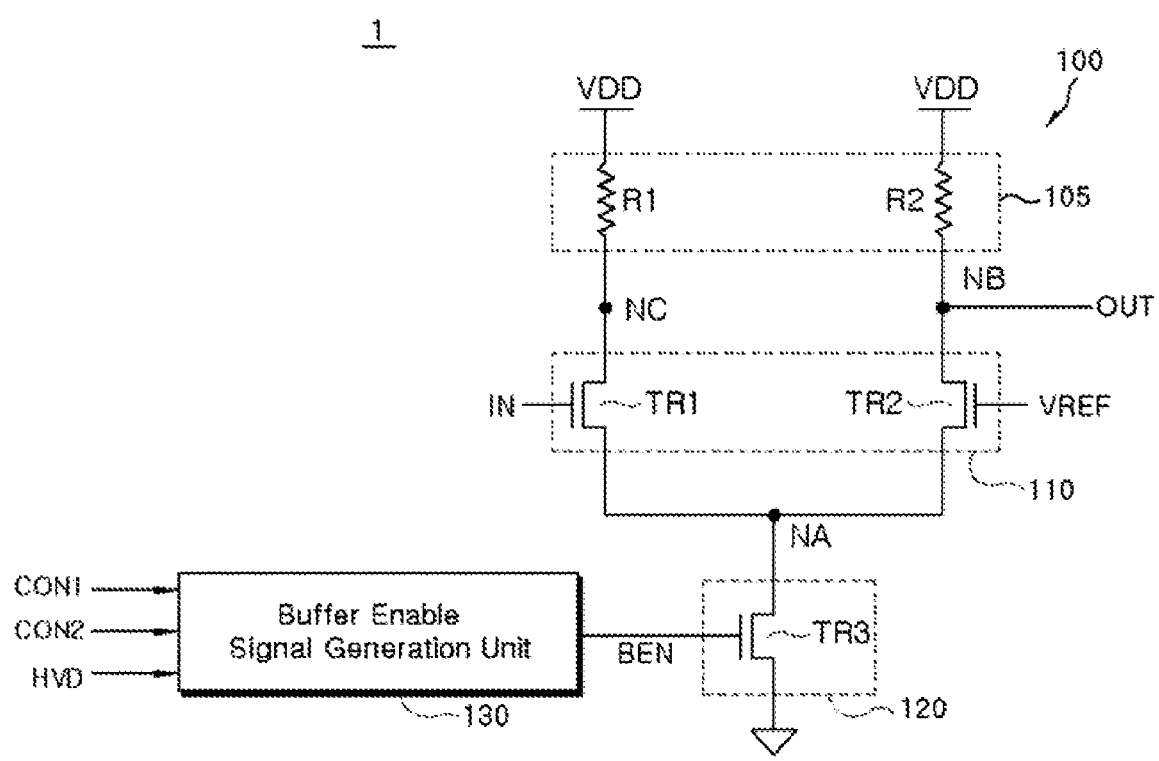
FIG. 1 is a diagram illustrating a buffer circuit according to an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like parts in the various figures and embodiments of the present invention.

The drawings are not necessarily to scale and, in some instances, proportions may have been exaggerated in order to clearly illustrate features of the embodiments. In this specification specific terms have been used. The terms are used to describe the present invention, and are not used to qualify the sense or limit the scope of the present invention.

It is also noted that in this specification, 'and/or' represents that one or more of components arranged before and after 'and/or' is included. Furthermore, "connected/coupled" refers to one component not only directly coupling another component but also indirectly coupling another component through an intermediate component. In addition, a singular form may include a plural form as long as it is not specifically mentioned. Furthermore, 'include/comprise' or 'including/comprising' used in the specification represents that one or more components, steps, operations, and elements exist or are added.

FIG. 1 is a diagram illustrating a buffer circuit 1 according to an embodiment of the present invention. Referring to FIG. 1, the buffer circuit 1 may include a buffer unit 100 and a buffer enable signal generation unit 130. The buffer unit 100 may buffer an input signal IN in response to a buffer enable signal BEN. The buffer unit 100 may include a load unit 105, an amplification unit 110 and a buffer enable unit 120.

The load unit 105 may include load resistors R1 and R2. The load resistors R1 and R2 may be replaced by a current mirror load whose output part acts as an active load. For example, the current mirror load may be formed of two PMOS transistors.

The amplification unit 110 may receive the input signal IN and a reference voltage VREF to generate an output signal OUT. The output signal OUT may have a high level when the input signal IN is higher than the reference voltage VREF, and have a low level when the input signal IN is lower than the reference voltage VREF. The reference voltage VREF may have a voltage corresponding to a half of the swing amplitude of the input signal IN. For example, when the input signal IN swings from a ground voltage VSS to a power supply voltage VDD, the reference voltage VREF may have a voltage corresponding to a half of the power supply voltage VDD. Furthermore, the reference voltage VREF may have a voltage corresponding to a complementary signal of the input signal IN.

The buffer enable unit 120 may enable the buffer circuit 1 in response to the buffer enable signal BEN. The buffer enable unit 120 may control the amplification unit 110 to sense and amplify the input signal IN and the reference voltage VREF when the buffer enable signal BEN is activated, and control the amplification unit 110 to not perform the sensing and amplifying operation when the buffer enable signal BEN is deactivated. The buffer enable unit 120 may form a current path from the amplification unit 110 to the ground voltage VSS, and thus enable the buffer circuit 1. That is, the buffer enable unit 120 may function as a current source when enabled.

The buffer enable signal generation unit 130 may receive a high voltage detection signal HVD, a first operation control signal CON1, and a second operation control signal CON2 to generate the buffer enable signal BEN. That is, the buffer enable signal generation unit 130 may generate the buffer enable signal BEN based on the first or second operation control signal CON1 or CON2, selected according to the high voltage detection signal HVD. The high voltage detection signal HVD may be generated by detecting the power supply voltage VDD. For example, the high voltage detection signal HVD may be generated from a voltage detector for detecting the power supply voltage VDD. The high voltage detection signal HVD may be activated when the power supply voltage VDD is greater than or equal to a predetermined voltage, and deactivated when the power supply voltage VDD is less than the predetermined voltage.

The first and second operation control signals CON1 and CON2 may include signals related to an operation of a semiconductor device or electronic device including the buffer circuit 1. The first operation may be performed before the second operation, and the first operation control signal CON1 may be activated before the second operation control signal CON2. Furthermore, the second operation may be performed while the first operation is performed. When a semiconductor device including the buffer circuit 1 stores and outputs data, the first operation may correspond to an active operation and the second operation may correspond to a read or write operation. The active operation may include an operation of activating a semiconductor device, the read operation may include an operation of outputting data stored in the semiconductor device, and the write operation may include an operation of storing data in the semiconductor device. In this case, the first operation control signal CON1 may include an active signal, which is generated based on an active command, and the second operation control signal CON2 may include a read or write signal, which is generated based on a read or write command.

The buffer enable signal generation unit 130 may generate the buffer enable signal BEN based on the first operation control signal CON1 when the high voltage detection signal HVD is activated, and generate the buffer enable signal BEN based on the second operation control signal CON2 when the high voltage detection signal HVD is deactivated. As described above, the first operation control signal CON1 is activated before the second operation signal CON2. Thus, when the high voltage detection signal HVD is activated, the buffer enable signal BEN may be activated earlier than when the high voltage detection signal HVD is deactivated. The buffer enable signal BEN may be activated earlier when the power supply voltage VDD is high, and activated later when the power supply voltage VDD is low.

The buffer circuit 1 may receive the input signal IN during the second operation. That is, the buffer circuit 1 may not receive the input signal IN when the first operation is performed, and may receive the input signal IN when the second operation is performed. Thus, when the buffer enable signal BEN is generated based on the first operation control signal CON1 the buffer circuit 1 may be enabled even before the second operation is performed.

In FIG. 1, the amplification unit 110 may include a first transistor TR1 and a second transistor TR2. Each of the first and second transistors TR1 and TR2 may include an N channel MOS transistor. The first transistor TR1 may have a gate receiving the input signal IN, a drain receiving the power supply voltage VDD through the load resistor R1, and a source coupled to a node NA. The second transistor TR2 may have a gate receiving the reference voltage VREF, a drain receiving the power supply voltage VDD through the load resistor R2, and a source coupled to the node NA. The buffer enable unit 120 may include a third transistor TR3. The third transistor TR3 may include an N channel MOS transistor. The third transistor TR3 may have a gate receiving the buffer enable signal BEN, a drain coupled to the node NA, and a source coupled to the ground voltage VSS. The third transistor TR3 may be turned on when the buffer enable signal BEN is activated, and form a current path between the node NA and the ground voltage VSS. Thus, when the third transistor TR3 is turned on, the buffer circuit 1 may be enabled.

When the input signal IN has a higher voltage than the reference voltage VREF, the amount of current flowing through the first transistor TR1 may become larger than the amount of current flowing through the second transistor TR2, and the voltage of a first output node NB may become higher than the voltage of a second output node NC. Thus, the buffer circuit 1 may generate an output signal OUT having a high level through the first output node NB. When the input signal IN has a lower voltage than the reference voltage VREF, the amount of current flowing through the first transistor TR1 may become smaller than the amount of current flowing through the second transistor TR2, and the voltage of the first output node NB may become lower than the voltage of the second output node NC. Thus, the buffer circuit 1 may generate an output signal OUT having a low level through the first output node NB.

Figure 2:
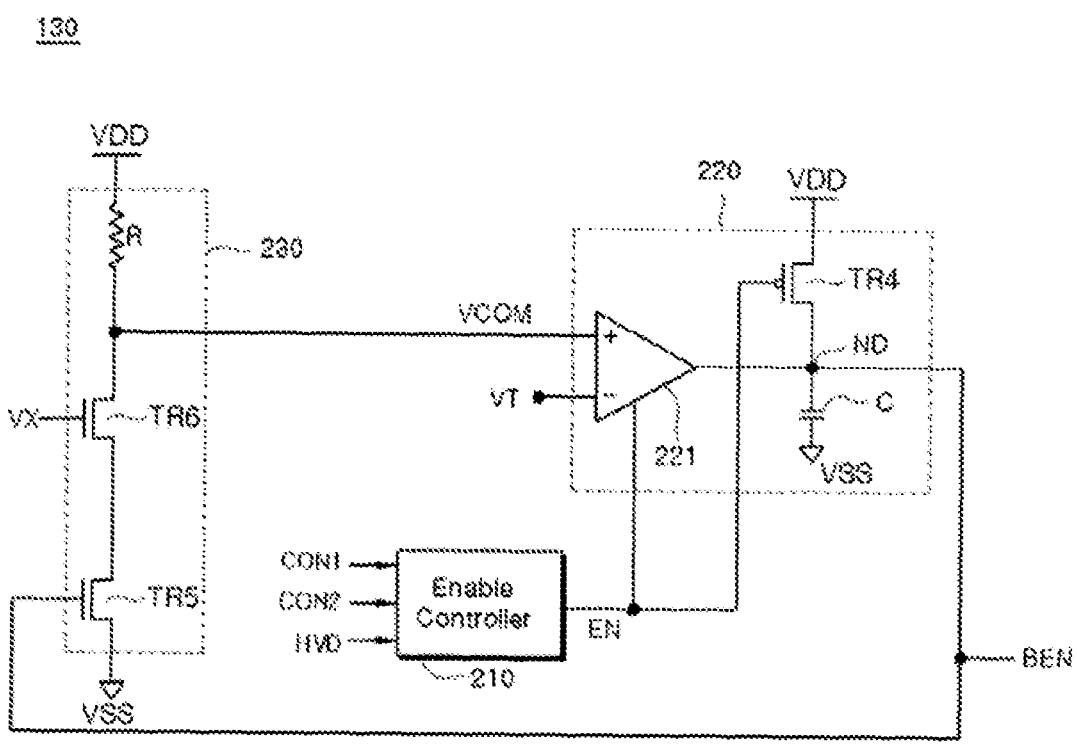
FIG. 2 is a detailed diagram of an enable signal generation unit illustrated in FIG. 1.

FIG. 2 is a detailed diagram of the buffer enable signal generation unit 130 illustrated in FIG. 1. Referring to FIG. 2, the buffer enable signal generation unit 130 may include an enable controller 210, a buffer enable voltage generator 220, and a comparison voltage generator 230.

The enable controller 210 may receive the high voltage detection signal HVD, the first operation control signal CON1, and the second operation control signal CON2 to generate an enable signal EN. The enable controller 210 may generate the enable signal EN based on the first operation control signal CON1 when the high voltage detection signal HVD is activated, and generate the enable signal EN based on the second operation control signal CON2 when the high voltage detection signal HVD is deactivated. The enable controller 210 may include a multiplexer, which selectively outputs one of the first and second operation control signals CON1 and CON2 as the enable signal EN based on the high voltage detection signal HVD.

The buffer enable voltage generator 220 may receive a comparison voltage VCOM, a target voltage VT, and the enable signal EN to generate the buffer enable signal BEN. The buffer enable voltage generator 220 may compare a voltage of the comparison voltage VCOM with the target voltage VT, and set a voltage of the buffer enable signal BEN to the target voltage VT. The target voltage VT may correspond to a voltage of the buffer enable signal BEN, at which the buffer enable unit 120 stably forms a current path. The buffer enable voltage generator 220 may be enabled in response to the enable signal EN, and perform the comparison operation and the generation operation for the buffer enable signal BEN in response to the enable signal EN.

The buffer enable voltage generator 220 may include a comparator 221, a fourth transistor TR4, and a capacitor C. The comparator 221 may perform a comparison operation in response to the enable signal EN. The comparator 221 may receive the comparison voltage VCOM and the target voltage VT, and perform the comparison operation until the comparison voltage VCOM reaches the target voltage VT. The fourth transistor TR4 may have a gate receiving the enable signal EN, a source receiving the power supply voltage VDD, and a drain coupled to a node ND. The fourth transistor TR4 may include a P channel MOS transistor, and the enable signal EN may be activated to a low level. The capacitor C is coupled to the node ND and the ground voltage VSS. The buffer enable signal may be generated from the node ND.

The comparison voltage generator 230 may receive the buffer enable signal BEN to generate a comparison voltage VCOM. The comparison voltage generator 230 may receive the buffer enable signal BEN and a bias voltage VX, and generate the comparison voltage VCOM. The comparison voltage generator 230 may decrease the level of the comparison voltage VCOM as the level of the buffer enable signal BEN increases, and increase the level of the comparison voltage as the level of the buffer enable signal BEN decreases.

The comparison voltage generator 230 may include a resistor R, a fifth transistor TR5, and a sixth transistor TR6. Each of the fifth and sixth transistors TR5 and TR6 may include an N channel MOS transistor. The fifth transistor TR5 may have a gate receiving the buffer enable signal BEN and a source coupled to the ground voltage VSS. The sixth transistor TR6 may have a gate receiving the bias voltage VX and a source coupled to the drain of the fifth transistor TR5. The resistor may have one terminal coupled to the drain of the sixth transistor TR6 and the other terminal receiving the power supply voltage VDD. The comparison voltage VCOM may be outputted from the node coupled to the one terminal of the resistor R and the drain of the sixth transistor TR6.

Figure 3:
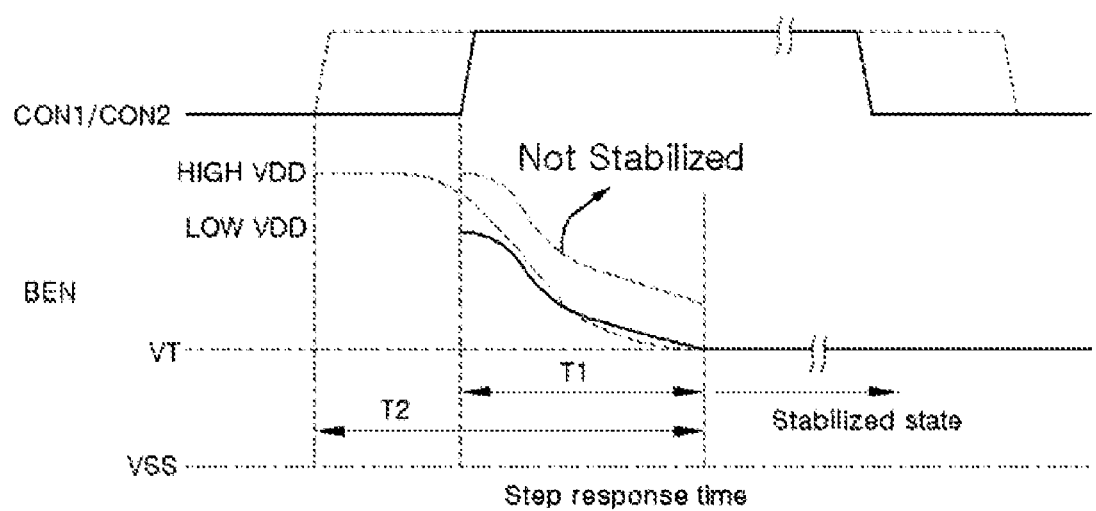
FIG. 3 is a timing diagram for describing an operation of the buffer circuit illustrated in FIG. 1.

FIG. 3 is a diagram for describing an operation of the buffer circuit 1 illustrated in FIG. 1. In FIG. 3, a curve with solid line indicates the buffer enable signal BEN, which is generated based on the second operation control signal CON2, and a curve with a dotted line indicates the buffer enable signal BEN, which is generated based on the first operation control signal CON1. In FIG. 3, the time required for the buffer circuit 1 to receive the input signal IN from when the first and second operation control signals CON1 and CON2 are activated, that is, when the first and second operations begin, may be defined as the step response time. The step response time may correspond to the time required for the voltage of the buffer enable signal BEN to stabilize to the level of the target voltage VT. The state after the voltage of the buffer enable signal BEN is stabilized to the target voltage VT may be defined as a stabilized state. The buffer circuit 1 may accurately sense and amplify an input signal when the input signal is received in the stabilized state.

When the power supply voltage VDD is less than a predetermined level (LOW VDD), the high voltage detection signal HVD may be deactivated, and the buffer enable signal generator 130 may generate the buffer enable signal EN based on the second operation control signal CON2. At this time, the enable controller 210 may enable the enable signal EN to generate the buffer enable signal BEN, according to the second operation control signal CON2. The buffer enable voltage generator 220 may set a voltage of the buffer enable signal BEN in the range from the power supply voltage VDD to the target voltage VT. When the power supply voltage VDD is less than the predetermined level (LOW VDD), a voltage of the buffer enable signal BEN may be set to the target voltage VT within the step response time T1.

On the other hand, when the power supply voltage VDD is greater than or equal to the predetermined voltage (HIGH VDD), the buffer enable signal BEN may not reach the target voltage VT within the step response time T1. Thus, the buffer circuit 1 may receive the input signal IN in a state where the buffer circuit 1 is not stabilized. When the power supply voltage VDD is equal to or more than the predetermined voltage (HIGH VDD), the high voltage detection signal HVD may be activated, and the buffer enable signal generator 220 may generate the buffer enable signal BEN in response to the first operation control signal CON1, instead of the second operation control signal CON2. When the enable controller 210 and the buffer enable voltage generator 220 are enabled in response to the first operation control signal CON1, the buffer enable signal BEN may be set to the target voltage VT at an earlier time, and the step response time T1 may be increased to a step response time T2. The buffer circuit 1 may secure an additional step response time, and stably set the voltage of the buffer enable signal BEN to the target voltage VT before receiving the input signal IN.

According to the embodiments of the present invention, an input signal may be sensed and amplified after the buffer circuit is sufficiently stabilized. Thus, the signal may be accurately received to ensure reliability of electronic devices having semiconductor devices.

While certain embodiments have been described above, it will be understood to those skilled in the art that the embodiments described are examples only. Accordingly, the inventive concept described herein should not be limited based on the embodiments. Rather, the inventive concept should only be limited in light of the claims that follow when taken in conjunction with the above description and accompanying drawings.

What is claimed is:

1. A buffer circuit comprising:
   an amplification unit suitable for sensing and amplifying an input signal and a reference voltage;
   a buffer enable unit suitable for enabling the amplification unit based on a buffer enable signal; and
   a buffer enable signal generation unit suitable for generating the buffer enable signal based on a first or second operation control signal, selected according to a high voltage detection signal generated by detecting a power supply voltage,
   wherein the high voltage detection signal is activated when the power supply voltage is greater than or equal to a predetermined voltage, and deactivated when the power supply voltage is less than the predetermined voltage.

2. The buffer circuit according to claim 1, wherein the first operation control signal is activated before the second operation control signal is activated.

3. The buffer circuit according to claim 1, wherein the buffer enable signal generation unit generates the buffer enable signal based on the first operation control signal when the high voltage detection signal is activated, and generates the buffer enable signal based on the second operation control signal when the high voltage detection signal is deactivated.

4. The buffer circuit according to claim 2, wherein the buffer circuit receives the input signal while the second operation control signal is activated.

5. The buffer circuit according to claim 1, wherein the buffer enable signal generation unit comprises:
an enable controller suitable for selectively outputting the first or second operation control signals as an enable signal based on the high voltage detection signal;
a voltage generator suitable for comparing a comparison voltage with a target voltage based on the enable signal, and setting the voltage of the buffer enable signal to the target voltage; and
a comparison voltage generator suitable for receiving the buffer enable signal to generate the comparison voltage.

6. A buffer circuit comprising:
an amplification unit suitable for sensing and amplifying an input signal and a reference voltage;
a buffer enable unit suitable for enabling the amplification unit based on a buffer enable signal; and
a buffer enable signal generation unit suitable for generating the buffer enable signal based on an active operation control signal or a control signal for read and write control signals, selected according to a high voltage detection signal,
wherein the active operation control signal is activated before the control signal for the read and write operations are activated.

7. The buffer circuit according to claim 6, wherein the buffer circuit receives the input signal during the read and write operations.

8. The buffer circuit according to claim 6, wherein the high voltage detection signal is activated when a power supply voltage is greater than or equal to a predetermined voltage, and deactivated when the power supply voltage is less than the predetermined voltage.

9. The buffer circuit according to claim 8, wherein the buffer enable signal generation unit generates the buffer enable signal based on the active operation control signal when the high voltage detection signal is activated, and generates the buffer enable signal based on the control signal for the read and write operations when the high voltage detection signal is deactivated.

10. The buffer circuit according to claim 6, wherein the buffer enable signal generation unit comprises:
an enable controller suitable for selectively outputting the active operation control signal or the control signal for the read and write operations as an enable signal based on the high voltage detection signal;
a voltage generator suitable for comparing a comparison voltage with a target voltage based on the enable signal, and setting the voltage of the buffer enable signal to the target voltage; and
a comparison voltage generator suitable for receiving the buffer enable signal to generate the comparison voltage having substantially the same voltage as the buffer enable signal.

11. A buffer circuit comprising:
a buffer unit suitable for buffering an input signal based on a buffer enable signal; and
a buffer enable signal generation unit suitable for generating the buffer enable signal based on a first or second operation control signal, selected according to a power supply voltage detection signal generated by detecting a power supply voltage,
wherein the first operation control signal is activated before the second operation control signal is activated, and
wherein the buffer circuit receives the input signal while the second operation control signal is activated.

12. The buffer circuit according to claim 11, wherein the power supply voltage detection signal is activated when the power supply voltage is greater than or equal to a predetermined voltage, and deactivated when the power supply voltage is less than the predetermined voltage.

13. The buffer circuit according to claim 12, wherein the buffer enable signal generation unit generates the buffer enable signal based on the first operation control signal when the power supply voltage detection signal is activated, and generates the buffer enable signal based on the second operation control signal when the power supply voltage detection signal is deactivated.

14. The buffer circuit according to claim 11, wherein the first operation control signal corresponds to an active operation, and the second operation control signal corresponds to a write operation.

15. The buffer circuit according to claim 11, wherein the buffer enable signal generation unit comprises:
an enable controller suitable for selectively outputting the first or second operation control signals as an enable signal based on the power supply voltage detection signal;
a voltage generator suitable for comparing a comparison voltage with a target voltage based on the enable signal, and setting the voltage of the buffer enable signal to the target voltage; and
a comparison voltage generator suitable for receiving the buffer enable signal to generate the comparison voltage having substantially the same voltage as the buffer enable signal.

* * * * *